United States Patent
Chen et al.

(10) Patent No.: US 6,715,524 B2
(45) Date of Patent: Apr. 6, 2004

(54) DFR LAMINATING AND FILM REMOVING SYSTEM

(75) Inventors: Li-Chen Chen, Taipei (TW); Chia-Tsun Hsu, Sanchung (TW); Chia-Fu Lin, Hsin-chu (TW); Kuo-Ching Lee, Tainan (TW); Yen-Ming Chen, Hsin-chu (TW); Kai-Ming Ching, Taiping (TW); Hsin-Hui Lee, Kaoshingh (TW); Chao-Yuan Su, Koahsiang (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 28 days.

(21) Appl. No.: 10/164,987

(22) Filed: Jun. 7, 2002

(65) Prior Publication Data

US 2003/0226638 A1 Dec. 11, 2003

(51) Int. Cl.[7] .................. B44C 1/165; B32B 31/20; B32B 7/06; B41M 3/12; B05D 5/12
(52) U.S. Cl. ............... 156/540; 156/543; 156/582; 156/584; 156/230; 156/247; 156/344; 427/148; 427/96; 427/331
(58) Field of Search .................. 156/230, 234, 156/233, 235, 238, 247, 288, 546, 541, 547, 543, 556, 580, 587, 583.1, 344, 584; 427/146, 147, 148, 96, 209, 289, 331

(56) References Cited

U.S. PATENT DOCUMENTS

| 5,009,735 A | * | 4/1991 | Ametani et al. ............ 156/241 |
| 5,106,450 A | * | 4/1992 | Freisitzer et al. ........... 156/517 |
| 5,310,442 A | * | 5/1994 | Ametani ...................... 156/353 |
| 5,328,546 A | * | 7/1994 | Brady et al. ................. 156/584 |
| 6,500,291 B1 | * | 12/2002 | Okada et al. ................ 156/230 |

FOREIGN PATENT DOCUMENTS

| JP | 62-293246 | * | 6/1986 | ............ G03F/7/00 |
| JP | 11-204917 | * | 7/1999 | ............ H05K/3/06 |
| JP | 2003-21896 | * | 1/2003 | ........... G03F/7/004 |

OTHER PUBLICATIONS

IBM–TDB, "Laminate and Trim Apparatus". IBM–TDB NN8606289, Jun. 1, 1986, see entire document.*

* cited by examiner

Primary Examiner—J. A. Lorengo
(74) Attorney, Agent, or Firm—Tung & Associates

(57) ABSTRACT

A DFR laminating and PET removing system which is capable of both laminating a dry film resist (DFR) layer on a semiconductor wafer and removing a DFR support film such as polyethylene terepthalate (PET) from the DFR layer on the wafer at a single location. The DFR laminating and PET removing system of the present invention comprises a PET support film removing head for removing a portion of PET film from the semiconductor wafer substrate after the PET film portion and dry film resist (DFR) portion are laminated from a DFR tape onto the wafer and before the DFR portion is cut from the DFR tape.

16 Claims, 2 Drawing Sheets

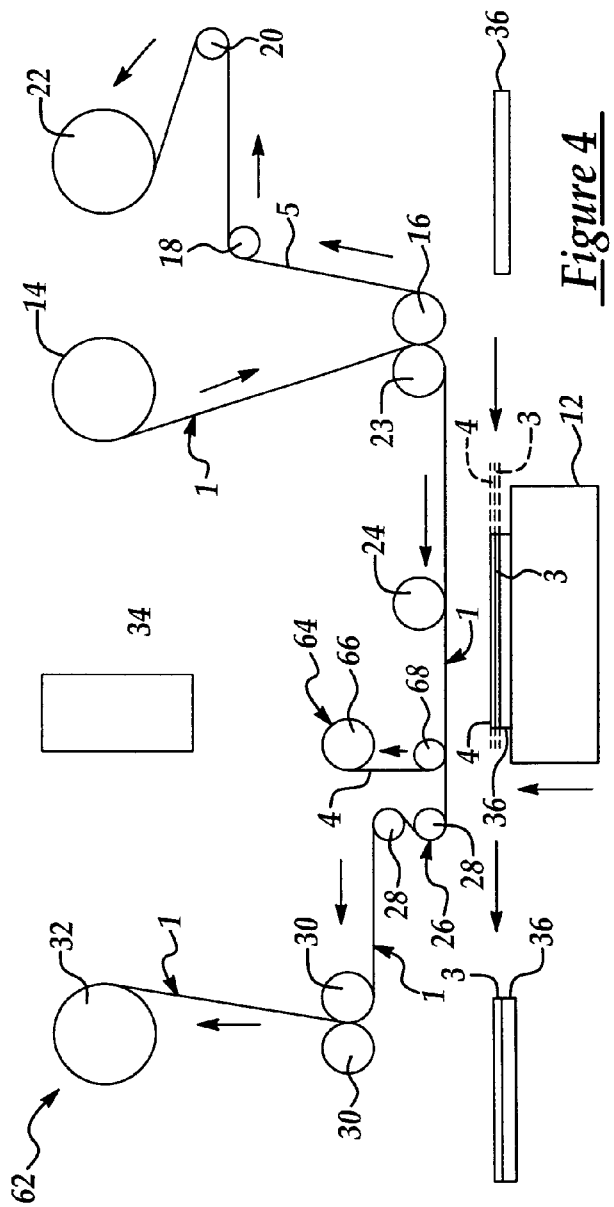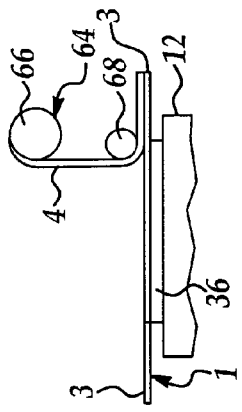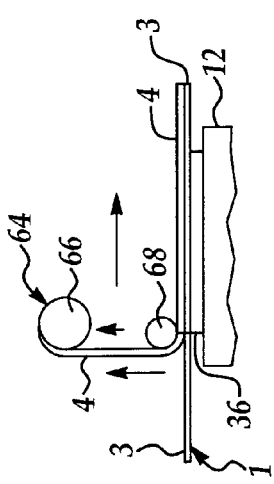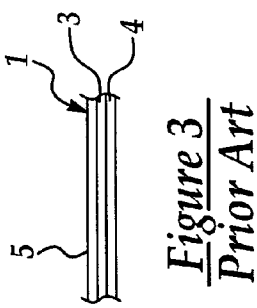
*Figure 4*
*Figure 5*
*Figure 6*
*Figure 3*
*Prior Art*

DFR LAMINATING AND FILM REMOVING SYSTEM

FIELD OF THE INVENTION

The present invention relates to systems used for laminating semiconductor wafer substrates with dry film resist (DFR) and systems used for removing a PET (polyethylene terepthalate) support film from the wafer substrates after the DFR laminating step. More particularly, the present invention relates to a system which is capable of both laminating DFR on a semiconductor wafer substrate and removing the support film from the substrate at the same location without the need to transfer the substrate between two separate stations for these purposes.

BACKGROUND OF THE INVENTION

In the fabrication of semiconductor integrated circuits, metal conductor lines are formed on a silicon wafer substrate to interconnect the multiple components in device circuits on the semiconductor wafer. A general process used in the deposition of metal conductor line patterns on semiconductor wafers includes deposition of a conducting layer on the silicon wafer substrate; formation of a photoresist or other mask such as titanium oxide or silicon oxide on the conductive layer, in the form of the desired metal conductor line pattern, using standard lithographic techniques; subjecting the wafer substrate to a wet or dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

Deposition of conductive layers on the wafer substrate can be carried out using any of a variety of techniques. These include oxidation, LPCVD (low-pressure chemical vapor deposition), APCVD (atmospheric-pressure chemical vapor deposition), and PECVD (plasma-enhanced chemical vapor deposition). In general, chemical vapor deposition involves reacting vapor-phase chemicals that contain the required deposition constituents with each other to form a nonvolatile film on the wafer substrate. Chemical vapor deposition is the most widely-used method of depositing films on wafer substrates in the fabrication of integrated circuits on the substrates. Copper is one of the most widely-used conductive layers in semiconductor fabrication due mainly to the inherent superior conductivity of copper as compared to aluminum and other metals.

Several lithograpic methods are known for forming a circuit pattern in a conductive layer on a wafer substrate. These include laminating a photoresist material, such as by using a dry film resist (DFR), on the conductive layer; using a visible light laser to irradiate the photoresist material in the form of the desired circuit pattern image; and then subjecting the irradiated wafer substrate to a developer, which selectively dissolves non-irradiated portions of the photoresist material and leaves irradiated portions of the photoresist material intact to form a mask corresponding to the circuit pattern. The masked substrate is then subjected to a wet or dry etching process, in which those areas of the conductive layer not covered by the mask are etched and those areas of the conductive layer covered by the mask remain unetched. Finally, the mask is removed such as by using plasma or reactive chlorine gas to expose the unetched metal circuit layer.

One of the most common materials for preparing a photoresist mask on a wafer substrate includes photopolymerizable elements, or dry film resists (DFRs), which are typically transferred from a DFR tape onto the conductive layer on the wafer substrate. A multi-layered construction of a typical DFR tape is generally indicated by reference numeral 1 in FIG. 3 and includes a support film 4 such as polyethylene terepthalate (PET). A photopolymerizable DFR layer 3 is provided on the PET support film 4, and a polyethylene protective film 5 may be provided on the DFR layer 3. The DFR layer 3 is applied to the wafer substrate by first removing the protective film 5 from the DFR tape 1 to expose the DFR layer 3. The DFR layer 3 and the PET support film 4 are then applied to the conductive layer on the wafer substrate 36. Finally, the PET support film 4 is removed from the underlying DFR layer 3.

FIG. 1 illustrates a typical conventional DFR laminating system 10 for laminating a DFR layer 3 and a PET protective film 4 on the wafer 36. The DFR laminating system 10 typically includes a rotatable tape supply reel 14, from which extends a segment of the DFR tape 1. The DFR tape 1 extends between a guide roller 23 and a nip roller 16, which removes the protective film 5 from the DFR layer 3 of the DFR tape 1, and the protective film 5 extends from the nip roller 16 and typically around a pair of guide rollers 18 and 20, respectively, and is collected on a protective film wind reel 22. The tape 1, with the protective layer 5 removed therefrom, is advanced between a laminating head 24 above and a vertically-extendible wafer support table 12 below thereof, and extends around a pair of remove head rollers 28 of a remove head 26. Accordingly, the wafer support table 12 initially receives an unlaminated wafer 36 having a conductive layer (not illustrated) such as copper deposited thereon. The remove head 26 and laminating head 24 initially move to the left in FIG. 1 to extend the DFR tape 1 above the surface of the wafer 36, at which time additional DFR tape 1 is simultaneously unwound from the rotating tape supply reel 14. Next, the wafer support table 12 raises the wafer 36 into contact with the DFR tape 1. As it moves to the right, the laminating head 24 then heat-presses the DFR tape 1 against the conductive layer (not illustrated) on the wafer 36, whereupon the DFR layer 3 is laminated onto the conductive layer of the wafer 36 and the PET support film 4 remains on the DFR layer 3 on the wafer 36. A laser 34 is then used to cut a portion of the DFR layer 3 and the PET support film 4 from the DFR tape 1, around the periphery of the wafer 36, such that the DFR layer 3 and PET support film 4 remaining on the wafer 36 substantially conform to the size and shape of the wafer 36. The remove head 26 is then moved to the right in FIG. 1 to remove the DFR tape 1 (consisting of the residual PET support film 4 and residual DFR layer 3 from which the PET support film 4 and DFR layer 3 portions, respectively, laminated onto the wafer 36 were cut) from the wafer 36, after which the DFR tape 1 is advanced first between the remove head rollers 28 of the remove head 26 and then between a pair of guide rollers 30, and finally, collected on a used tape wind reel 32. The wafer support table 12 is then lowered and the wafer 36, having the DFR layer 3 and PET support film 4 laminated thereon, is removed therefrom.

Referring next to FIG. 2, after it is removed from the wafer support table 12 of the DFR laminating system 10, the laminated wafer 36, having both the DFR layer 3 and the PET support film 4 laminated thereon, is transferred to a PET removing system 40 and placed on a vertically-extendible wafer support table 12 to remove the PET support film 4 from the DFR layer 3 on the wafer 36 for further processing of the wafer 36. The PET removing system 40 typically includes a tape supply reel 42, from which is extended a segment of adhesive tape 7. The adhesive tape 7 extends over a guide roller 44 and around the bottom arc of a tape applicator head 46, and upwardly between the adjacent remover head rollers 49 of a remover head 48. The adhesive tape 7 may further extend around guide rollers 50, 52 and between an additional pair of adjacent guide rollers 54 before winding on a used tape wind reel 58. Accordingly, after positioning of the laminated wafer 36 on the support table 12, the wafer support table 12 raises the wafer 36 as the remover head 48 is moved to the leftmost position in FIG. 2 and a length of the adhesive tape 7 is unwound from the tape supply reel 42. The tape applicator head 46 initially contacts the leftmost edge of the PET support film 4 on the wafer 36. As the remover head 48 is moved to the right in FIG. 2, the tape applicator head 46 presses the adhesive tape 7 against the PET support film 4 and removes the PET support film 4 from the underlying DFR layer 3 as the tape applicator head 46 traverses the width of the wafer 36. The adhesive tape 4, with the PET support film 4 removed from the wafer 36 adhering thereto, is finally wound on the used tape wind reel 58.

One of the limitations inherent in operation of the conventional DFR laminating system 10 and the temporally- and spatially-separate PET removing system 40 is that the laminated wafer 36 must be removed from the wafer support table 12 of the DFR laminating system 10 and transferred to the wafer support table 12 of the PET removing system 40 for removal of the PET support film 4 from the wafer 36. This results in accumulation of significant lag time between the processes in the treatment of multiple semiconductor wafers 36 over time. Furthermore, since the laminating process and the PET film removal processes require separate stations in the clean room, the equipment for the two systems occupies a much greater volume of valuable clean room space than would be needed if the systems were consolidated into a single system for performing both functions.

SUMMARY OF THE INVENTION

Accordingly, an object of the present invention is to provide a system for consolidating the DFR wafer laminating and support film removal processes in a semiconductor fabrication facility.

Another object of the present invention is to provide a system and method for increasing the wafer per hour (WPH) throughput of wafers processed in a semiconductor fabrication facility.

Still another object of the present invention is to provide a system and method for both laminating a conductive layer on a semiconductor wafer substrate with a dry film resist (DFR) layer and removing a typically polyethylene terepthalate (PET) support layer from the DFR layer.

Yet another object of the present invention is to provide a dry film resist laminating and PET removal system which consolidates valuable footprint space in a semiconductor production facility clean room.

A still further object of the present invention is to provide a system which saves time and space in the laminating of a dry film resist (DFR) layer on a semiconductor wafer substrate and removal of a support film such as polyethylene terepthalate (PET) from the dry film resist layer for further processing of the wafer.

In accordance with these and other objects, the present invention includes a DFR laminating and film removing system which is capable of both laminating a dry film resist (DFR) layer on a semiconductor wafer and removing a DFR support film such as polyethylene terepthalate (PET) from the DFR layer on the wafer at a single location. The DFR laminating and support film removing system of the present invention comprises a support film removing head for removing a portion of support film from the semiconductor wafer substrate after the support film portion and dry film resist (DFR) portion are laminated from a DFR tape onto the wafer and before the laminated DFR portion is cut from the DFR tape.

BRIEF DESCRIPTION OF THE DRAWINGS

The invention will now be described, by way of example, with reference to the accompanying drawings, in which:

FIG. 3 is a side view, partially in section, of a typical conventional DFR tape, more particularly illustrating a three-layered construction of the tape;

FIG. 4 is a schematic view of a DFR laminating and removing system of the present invention, illustrating laminating of a DFR layer from a DFR tape onto a semiconductor wafer and removal of a support film from the DFR layer;

FIG. 5 is a side view of a support film removing head of the DFR laminating and removing system of the present invention, with the support film removing head in a position preparatory to removing the support film from the DFR layer after lamination of the DFR layer onto the semiconductor wafer; and FIG. 6 is a side view of the support film removing head, after removing the support film from the DFR layer.

DESCRIPTION OF THE PREFERRED EMBODIMENTS

Figure 1:
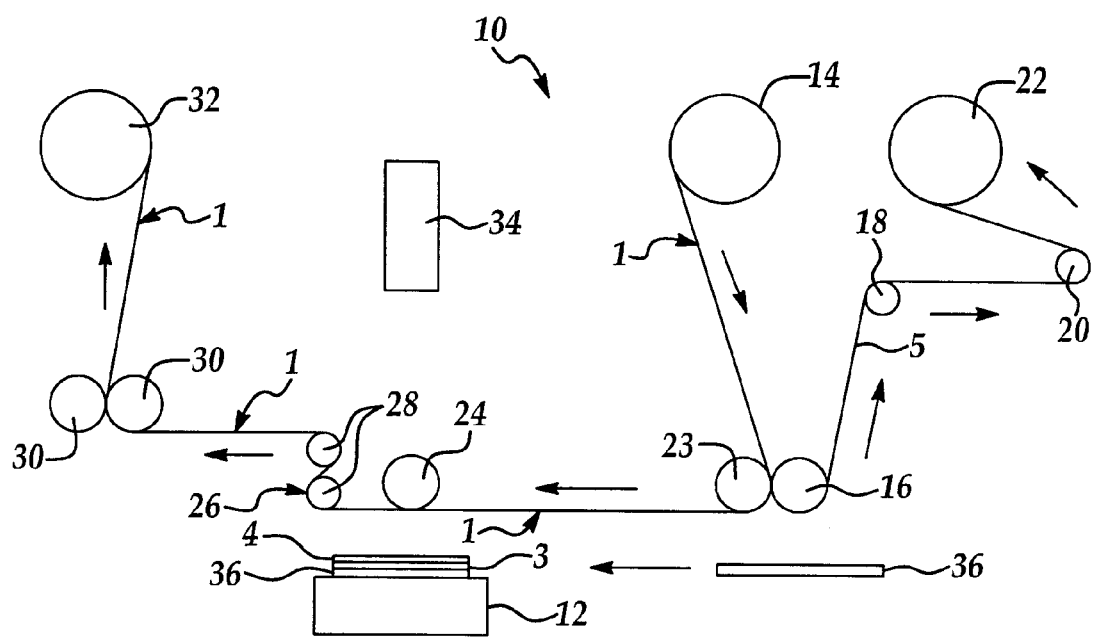
FIG. 1 is a schematic view of a typical conventional DFR laminating system, used in the lamination of a DFR layer and a support film from a DFR tape onto a semiconductor wafer.
Figure 2:
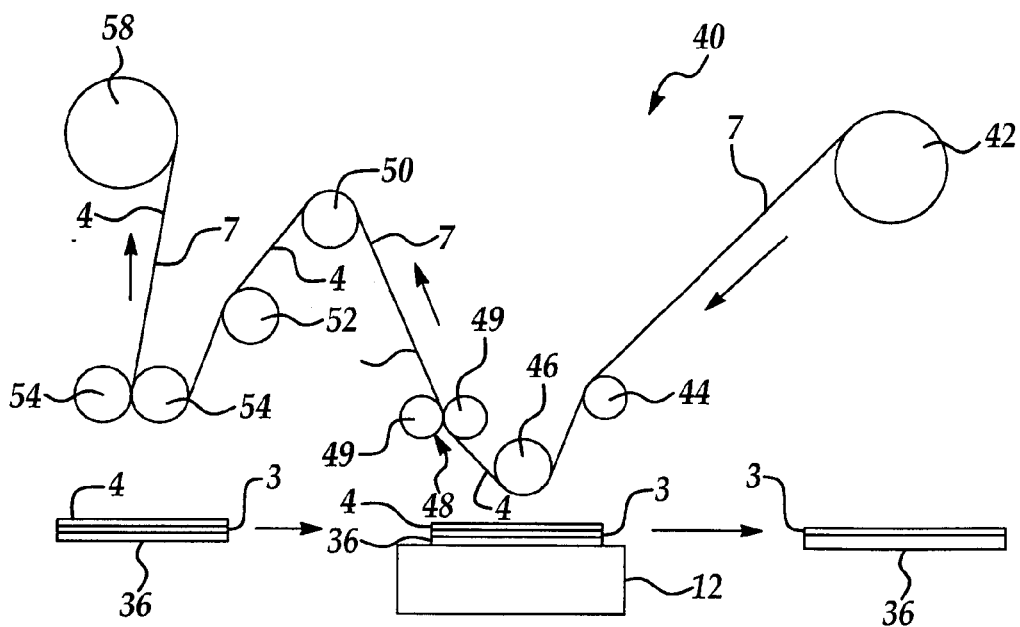
FIG. 2 is a schematic view of a typical conventional support film removing system, used in the removal of a support film from the DFR layer laminated on the wafer.

Referring next to FIGS. 3–6 of the drawings, an illustrative embodiment of the DFR laminating and removing system of the present invention is generally indicated by reference numeral 62 in FIG. 4 and typically includes a rotatable tape supply reel 14, from which is periodically extended increments or segments of DFR tape 1 wound thereon. The DFR tape 1 may be conventional and, as illustrated in FIG. 3, typically has a three-layered construction, with a dry film resist (DFR) layer 3 sandwiched between a typically polyethylene protective film 5 and a polyethylene terepthalate (PET) support film 4. The DFR tape 1 extends downwardly from the tape supply reel 14 between a guide roller 23 and an adjacent nip roller 16, which initially removes the protective film 5 from the DFR layer 3 of the DFR tape 1 as the DFR tape 1 is incrementally advanced from the tape supply reel 14 in application of the system 62 as hereinafter described. As it is removed from the DFR tape 1, the protective film 5 extends from the nip roller 16 and typically around a pair of guide rollers 18 and 20, respectively, and may be progressively collected on a protective film wind reel 22.

The DFR tape 1, with the protective layer 5 removed therefrom at the nip roller 16, is advanced horizontally from the guide roller 23 and between a laminating head 24 above and a vertically-extendible wafer support table 12 below thereof. The DFR tape 1 extends horizontally from the guide roller 23 and around a pair of adjacent remove head rollers 28 of a tape removing head 26. In application of the system 62 as hereinafter described, the wafer table 12 initially receives an unlaminated wafer substrate 36 and supports the wafer substrate 36 during the lamination process. The tape removing head 26 and the laminating head 24 are each capable of bidirectional horizontal movement above the entire width of the wafer 36 resting on the wafer support table 12, typically in the same manner as the tape removing head 26 and laminating head 24 of the conventional DFR laminating system 10 heretofore described with respect to FIG. 1. From the remove head 26, the DFR tape 1 may extend between a pair of adjacent guide rollers 30 and be wound on a used tape reel 32. A laser 34 is typically disposed above the DFR tape 1 for cutting the portion of the DFR layer 3 laminated onto the wafer 36 from the DFR tape 1 after removal of the PET layer 4 from the DFR tape 1, as hereinafter described.

A support film removing head 64 of the system 62 typically includes a contact roller 68 around which is trained a segment of the PET support film 4 which is removed or peeled from the DFR layer 3 of the DFR tape 1. The peeled or removed segment of the support film 4 is continuous with the remaining portion of the support film 4 which remains attached to the DFR layer 3 in the DFR tape 1. From the contact roller 68, the peeled or removed segment of the support film 4 is further wound around a support film wind reel 66 of the support film removing head 64. The support film removing head 64 is capable of positioning between a leftmost position in which the contact roller 68 thereof is located above the leftmost edge of the wafer 36, as illustrated in FIGS. 4 and 5, and a rightmost position in which the contact roller 68 is located at the rightmost edge of the wafer 36, as illustrated in FIG. 6. Such bidirectional horizontal positioning capability of the support film removing head 64 may be accomplished in the same manner as the bidirectional horizontal positioning capability of the tape removing head 26 and the laminating head 24, respectively, according to the knowledge of those skilled in the art. Accordingly, in application of the system 62 as hereinafter described, the support film removing head 64 traverses the surface of the wafer 36 from the leftmost edge to the rightmost edge thereof as the support film 4 is peeled or removed from the underlying DFR layer 3 of the DFR tape 1 and wound on the support film wind reel 66, as illustrated in FIGS. 5 and 6.

In application of the system 62 of the present invention, the wafer support table 12 initially receives an unlaminated wafer 36 having a conductive layer (not illustrated) previously deposited on the upper surface thereof. A segment of the support film 4 is peeled or removed from the DFR tape 1, trained around the contact roller 68 and wound on the support film wind reel 66 of the support film removing head 64, with the remainder of the support film 4 remaining adherent to the underlying DFR layer 3 in the DFR tape 1. The tape removing head 26 initially moves to the leftmost position as illustrated in FIG. 4 to extend the DFR tape 1 above the surface of the wafer 36. Next, the support film removing head 64 is moved to the leftmost position as illustrated in FIG. 4, at which time a segment of the DFR tape 1 is simultaneously unwound from the rotating tape supply reel 14 since the support film 4 of the DFR tape 1 is wound on the support film wind reel 66 of the support film removing head 64. The wafer support table 12 then raises the wafer 36 into contact with the DFR tape 1. As it moves from the right to the left, as illustrated in FIG. 4, the laminating head 24 then hot-presses the DFR tape 1 against the conductive layer (not illustrated) on the wafer 36, whereupon the DFR layer 3 is laminated onto the conductive layer of the wafer 36, and the support film 4 initially remains on the DFR layer 3 on the wafer 36. The laminating head 24 may subsequently be moved from the left back to the original, righthand position to further heat-press the DFR tape 1 against the wafer 36. Next, as illustrated in FIGS. 5 and 6, the support film removing head 64 is moved from the left position to the right position, whereupon the support film 4 is peeled or removed from the underlying DFR layer 3 across the entire width of the wafer 36 until the support film removing head 64 reaches the rightmost edge of the wafer 36. Simultaneously, the peeled or removed segment of the support film 4 is trained around the contact roller 68 and wound on the support film wind reel 66 and remains continuous with the rest of the support film 4 adherent to the underlying DFR layer 3 of the DFR tape 1. A laser 34 is then used to cut the laminated portion of the exposed DFR layer 3 from the DFR tape 1, around the periphery of the wafer 36, such that the portion of the DFR layer 3 laminated on the wafer 36 substantially conforms to the size and shape of the wafer 36. The tape removing head 26 is then moved to the right with respect to the position thereof in FIG. 4 to remove the DFR tape 1 (consisting of the residual DFR layer 3 from which the support film 4 was peeled or removed and from which the DFR layer 3 portion laminated on the wafer 36 was cut) from the wafer 36.

As heretofore stated, each time the support film removing head 64 is moved from the right to the left preparatory to laminating the DFR tape 1 onto the wafer 36, an additional segment of the DFR tape 1 is removed or unwound from the rotating tape supply reel 14. This movement of the DFR tape 1 causes the used segment of the DFR tape 1, consisting of the residual DFR layer 3, to be advanced first between the remove head rollers 28 of the remove head 26 and then between a pair of adjacent guide rollers 30, and finally, to be collected on a used tape wind reel 32. After the DFR layer 3 laminated on the wafer 36 is cut from the DFR tape 1 typically by operation of the laser 34, as heretofore described, the wafer support table 12 is lowered and the wafer 36, having the DFR layer 3 laminated thereon, is removed therefrom for further processing of the wafer 36 at a separate processing station.

While the preferred embodiments of the invention have been described, it will be recognized and understood that various modifications can be made in the invention and the appended claims are intended to cover all such modifications which may fall within the spirit and scope of the invention.

Having described our invention with the particularity set forth above, we claim:

1. A DFR laminating and removing system for laminating a DFR layer from a tape onto a substrate and removing a support film from the DFR layer, said system comprising:

a first reel for receiving and unwinding the tape;

a second reel provided in spaced-apart relationship to said first reel for receiving and winding the tape;

a support disposed adjacent to a first surface of the tape for receiving the substrate;

a laminating head disposed adjacent to a second surface of the tape for laminating the DFR layer onto the substrate; and a support film removing head disposed adjacent to the second surface of the tape for receiving the support film from the tape, said support film removing head movable longitudinally along the tape for removing the support film from the tape.

2. The system of claim 1 wherein said support film removing head comprises a contact roller for engaging the support film on the tape and a support film wind reel spaced from said contact roller for receiving and winding the support film.

3. The system of claim 1 further comprising a tape removing head disposed between said first reel and said second reel for removing the tape from the substrate.

4. The system of claim 3 wherein said support film removing head comprises a contact roller for engaging the support film on the tape and a support film wind reel spaced from said contact roller for receiving and winding the support film.

5. The system of claim 1 wherein said support is movable between a first position for contacting the substrate with the tape and a second position for withdrawing the substrate from the tape.

6. The system of claim 5 wherein said support film removing head comprises a contact roller for engaging the support film on the tape and a support film wind reel spaced from said contact roller for receiving and winding the support film.

7. The system of claim 5 further comprising a tape removing head disposed between said first reel and said second reel for removing the tape from the substrate.

8. The system of claim 7 wherein said support film removing head comprises a contact roller for engaging the support film on the tape and a support film wind reel spaced from said contact roller for receiving and winding the support film.

9. A DFR laminating and removing system for laminating a DFR layer from a tape onto a substrate and removing a protective film and a support film from the DFR layer, said system comprising:

a first reel for receiving and unwinding the tape;

a second reel provided in spaced-apart relationship to said first reel for receiving and winding the tape;

a nip roller provided between said first reel and said second reel for removing the protective film from the tape;

a support disposed adjacent to a first surface of the tape for receiving the substrate;

a laminating head disposed adjacent to a second surface of the tape for laminating the DFR layer onto the substrate; and a support film removing head disposed adjacent to the second surface of the tape for receiving the support film from the tape, said support film removing head movable longitudinally along the tape for removing the support film from the tape.

10. The system of claim 9 wherein said support film removing head comprises a contact roller for engaging the support film on the tape and a support film wind reel spaced from said contact roller for receiving and winding the support film.

11. The system of claim 9 further comprising a tape removing head disposed between said first reel and said second reel for removing the tape from the substrate.

12. The system of claim 11 wherein said support film removing head comprises a contact roller for engaging the support film on the tape and a support film wind reel spaced from said contact roller for receiving and winding the support film.

13. The system of claim 9 wherein said support is movable between a first position for contacting the substrate with the tape and a second position for withdrawing the substrate from the tape.

14. The system of claim 13 wherein said support film removing head comprises a contact roller for engaging the support film on the tape and a support film wind reel spaced from said contact roller for receiving and winding the support film.

15. The system of claim 13 further comprising a tape removing head disposed between said first reel and said second reel for removing the tape from the substrate.

16. The system of claim 15 wherein said support film removing head comprises a contact roller for engaging the support film on the tape and a support film wind reel spaced from said contact roller for receiving and winding the support film.

* * * * *